(12) United States Patent
Yang et al.

(10) Patent No.: US 8,769,390 B2
(45) Date of Patent: Jul. 1, 2014

(54) APPARATUS AND METHOD FOR PROCESSING OPERATIONS IN PARALLEL USING A SINGLE INSTRUCTION MULTIPLE DATA PROCESSOR

(75) Inventors: Ho Yang, Hwaseongi-si (KR); Hyun Seok Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 13/364,687

(22) Filed: Feb. 2, 2012

(65) Prior Publication Data

US 2012/0311302 A1  Dec. 6, 2012

(30) Foreign Application Priority Data

Jun. 2, 2011  (KR) .................. 10-2011-0053512

(51) Int. Cl.
 *H03M 13/00* (2006.01)
(52) U.S. Cl.
 USPC .......................................... 714/795; 714/755
(58) Field of Classification Search
 USPC ................ 714/794, 795, 796, 786, 755
 See application file for complete search history.

(56) References Cited

U.S. PATENT DOCUMENTS

| | | | |
|---|---|---|---|
| 5,752,001 A | 5/1998 | Dulong | |
| 5,805,875 A | 9/1998 | Asanovic | |
| 6,718,504 B1 * | 4/2004 | Coombs et al. | 714/755 |
| 6,892,344 B2 * | 5/2005 | Becker | 714/794 |
| 6,954,841 B2 * | 10/2005 | Moreno et al. | 712/9 |
| 7,530,010 B2 * | 5/2009 | Jeon et al. | 714/792 |
| 8,099,657 B2 * | 1/2012 | Becker et al. | 714/795 |
| 2003/0014457 A1 | 1/2003 | Desai et al. | |
| 2004/0006681 A1 * | 1/2004 | Moreno et al. | 712/4 |
| 2004/0010321 A1 * | 1/2004 | Morishita et al. | 700/2 |
| 2006/0136802 A1 * | 6/2006 | Jeon et al. | 714/792 |
| 2008/0112514 A1 * | 5/2008 | Pisek | 375/341 |
| 2008/0133879 A1 | 6/2008 | Yang et al. | |
| 2011/0138259 A1 * | 6/2011 | Tan et al. | 714/792 |
| 2011/0307767 A1 * | 12/2011 | Kelin et al. | 714/795 |

FOREIGN PATENT DOCUMENTS

| | | |
|---|---|---|
| KR | 1998-018072 A | 6/1998 |
| KR | 10-2001-0085614 A | 9/2001 |
| KR | 10-2005-0071614 A | 7/2005 |
| KR | 10-2005-0080720 A | 8/2005 |
| KR | 10-2006-0069167 A | 6/2006 |
| KR | 10-2007-0035912 A | 4/2007 |
| KR | 10-2007-0118623 A | 12/2007 |
| KR | 10-2008-0014722 A | 2/2008 |
| KR | 10-2008-0015836 A | 2/2008 |

* cited by examiner

*Primary Examiner* — Esaw Abraham
*Assistant Examiner* — Osman Alshack
(74) *Attorney, Agent, or Firm* — NSIP Law

(57) ABSTRACT

A parallel operation processing apparatus and method using a Single Instruction Multiple Data (SIMD) processor are provided. The parallel operation processing apparatus may combine input data of source nodes in a current column with input data of source nodes in a previous column, and may store the combined input data.

21 Claims, 11 Drawing Sheets

100

APPARATUS AND METHOD FOR PROCESSING OPERATIONS IN PARALLEL USING A SINGLE INSTRUCTION MULTIPLE DATA PROCESSOR

CROSS-REFERENCE TO RELATED APPLICATION(S)

This application claims the benefit under 35 U.S.C. §119 (a) of Korean Patent Application No. 10-2011-0053512, filed on Jun. 2, 2011, in the Korean Intellectual Property Office, the entire disclosure of which is incorporated herein by reference for all purposes.

BACKGROUND

1. Field

The following description relates to a method and apparatus for processing operations in parallel using a Single Instruction Multiple Data (SIMD) processor.

2. Description of Related Art

Single Instruction Multiple Data (SIMD) is a class of parallel computing for processing multiple pieces of data using a single instruction. SIMD enables a plurality of operation apparatuses to simultaneously process multiple data by applying the same operation or a similar operation to the multiple data. For example, SIMD may be used in a vector processor.

A decoder such as a Viterbi decoder may be included in a processor. A Viterbi decoder uses a Viterbi algorithm to decode a bitstream that has been encoded using forward error correction. Viterbi decoding typically includes three operations, for example, a Branch Metric Computation (BMC) operation, an Add-Compare-Select (ACS) operation, and a Traceback (TB) operation. In the BMC operation, branch metrics are computed. In the ACS operation, computed metrics are compared, and a branch is selected. In the TB operation, traceback is performed.

However, because a capacity of a memory required for decoding has increased in response to an increase in a depth of Viterbi decoding, the overall hardware logic has increased in size. Additionally, due to a small amount of ACS operation result information, memory may be wasted when the ACS operation result information is stored.

Accordingly, there is a desire for a technology that may effectively use memory during Viterbi decoding, to reduce the size of the overall hardware logic, and to reduce wasted memory space, even if a depth of the Viterbi decoding is increased.

SUMMARY

In one general aspect, there is provided a parallel operation processing apparatus, including a parallel operator configured to calculate a path value of source nodes in a current column, and to determine input data and at least one source node in a previous column, the input data corresponding to a path selected using the path value, and a data arrangement unit configured to arrange first input data of the source nodes in the current column, based on an order of second input data of the at least one source node in the previous column, wherein the parallel operator combines the arranged first input data with the second input data, based on a register processing unit, and stores the combined input data in a parallel register unit.

The parallel operator may be configured to perform a bit shift operation on the second input data, combine the arranged first input data with the second input data on which the bit shift operation is performed, and store the combined input data.

The data arrangement unit may be configured to arrange the first input data such that the first input data is physically concatenated with the second input data.

The parallel operator may be configured to store, for every register processing unit, index information indicating the at least one source node in the previous column.

The index information may comprise information about source nodes in a last column of a previous register that are logically connected to source nodes in a first column of a current register, based on the selected path.

If a plurality of path values exist in each of the source nodes in the current column, the parallel operator may be further configured to determine a minimum path value among the plurality of path values, and store the determined minimum path value in the parallel register unit by overwriting the determined minimum path value to a location in which a minimum path value in the at least one source node in the previous column is stored.

The parallel operator may be configured to calculate path values in source nodes in a last column, and trace back input data of source nodes in previous columns that are connected to a final source node corresponding to a minimum path value among the calculated path values.

The parallel operator may be configured to acquire input data corresponding to source nodes connected to the final source node by repeating the tracing from the source nodes in the last column to source nodes in a first column.

The parallel operator may be configured to calculate the path value by accumulating, based on the current column, metrics of source nodes computed for each column by performing Viterbi decoding.

The at least one source node in the previous column may be logically connected to each of the source nodes in the current column based on the selected path.

In another aspect, there is provided a parallel operation processing method, including calculating a path value of source nodes in a current column, determining input data and at least one source node in a previous column, the input data corresponding to a path selected using the path value, arranging first input data of the source nodes in the current column, based on an order of second input data of the at least one source node in the previous column, and combining the arranged first input data with the second input data, based on a register processing unit, and storing the combined input data.

The combining may comprise performing a bit shift operation on the second input data, combining the arranged first input data with the second input data on which the bit shift operation is performed, and storing the combined input data in a parallel register unit.

The arranging may comprise arranging the first input data such that the first input data is physically concatenated with the second input data.

The combining may comprise storing, for every register processing unit, index information indicating the at least one source node in the previous column.

The index information may comprise information about source nodes in a last column of a previous register that are logically connected to source nodes in a first column of a current register based on the selected path.

The determining may comprise, if a plurality of path values exist in each of the source nodes in the current column, determining a minimum path value among the plurality of path values, and the combining comprises storing the determined minimum path value in the parallel register unit by overwriting the determined minimum path value to a location in which a minimum path value in the at least one source node in the previous column is stored.

The calculating may comprise calculating path values in source nodes of a last column, and tracing back input data of source nodes of previous columns that are connected to a final source node corresponding to a minimum path value among the calculated path values.

The calculating may comprise acquiring input data corresponding to source nodes connected to the final source node by repeating the tracing from the source nodes in the last column to source nodes in a first column.

The path value may be calculated by accumulating, based on the current column, metrics of source nodes computed for each column by performing Viterbi decoding.

The at least one source node in the previous column may be logically connected to each of the source nodes in the current column based on the selected path.

In another aspect, there is provided a computer-readable storage medium having stored therein program instructions to cause a computer to implement a parallel operation processing method including calculating a path value of source nodes in a current column, determining input data and at least one source node in a previous column, the input data corresponding to a path selected using the path value, arranging first input data of the source nodes in the current column, based on an order of second input data of the at least one source node in the previous column, and combining the arranged first input data with the second input data, based on a register processing unit, and storing the combined input data.

Other features and aspects will be apparent from the following detailed description, the drawings, and the claims.

Figure 1:
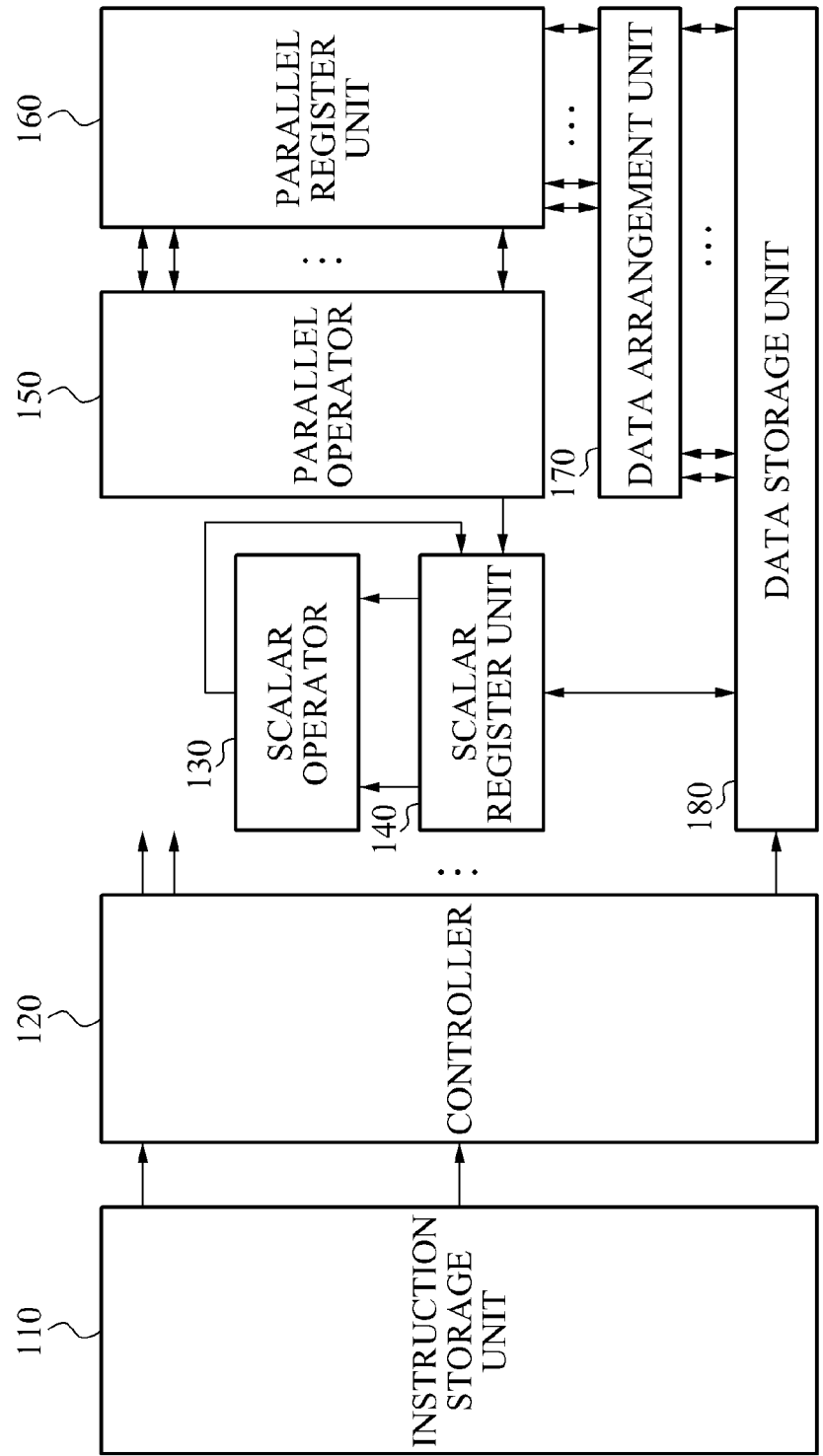
FIG. 1 is a diagram illustrating an example of a parallel operation processing apparatus including a Single Instruction Multiple Data (SIMD) processor.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, description of well-known functions and constructions may be omitted for increased clarity and conciseness.

FIG. 1 illustrates an example of a parallel operation processing apparatus including a Single Instruction Multiple Data (SIMD) processor. The parallel operation processing apparatus may be included in a terminal, for example, a computer, a mobile phone, a tablet, a game console, a home appliance, and the like.

Referring to FIG. 1, parallel operation processing apparatus 100 includes an instruction storage unit 110, a controller 120, a scalar operator 130, a scalar register unit 140, a parallel operator 150, a parallel register unit 160, a data arrangement unit 170, and a data storage unit 180.

The instruction storage unit 110 may store instructions used to control various operations performed in the parallel operation processing apparatus 100. For example, the instruction storage unit 110 may store instructions associated with operations for processing Viterbi decoding such as a Branch Metric Computation (BMC) instruction, an Add-Compare-to Select (ACS) instruction, a Traceback (TB) instruction, and the like. The BMC instruction may be used to compute branch metrics. The ACS instruction may be used to compare path metrics (hereinafter, referred to as "path values") for each node which are generated by accumulating the computed branch metrics, and to select a path metric from among the path metrics. The TB instruction may be used to trace back source nodes in previous columns that are connected to a node corresponding to a minimum path metric among path metrics of source nodes that are included in a last column.

The controller 120 may generate a control signal corresponding to an instruction stored in the instruction storage unit 110. For example, the controller 120 may generate a control signal to control the parallel operation processing apparatus 100 that includes the SIMD processor.

The data storage unit 180 may store input data that is used to perform Viterbi decoding, and operation result data that is obtained as a result of the Viterbi decoding. For example, the data storage unit 180 may store a BMC operation result that is obtained by the BMC operation, an ACS operation result that is obtained by the ACS operation, and a TB operation result that is obtained by the TB operation.

The scalar operator 130 may process an operation, for example, an operation that is difficult or less efficient to process in parallel.

The scalar register unit 140 may include registers that are used to perform an operation by the scalar operator 130.

The parallel operator 150 may process an operation to process a plurality of pieces of data using a single instruction. For example, the parallel operator 150 may be a SIMD operator.

The parallel register unit 160 may include registers that are used to perform an operation by the parallel operator 150. For example, the parallel register unit 160 may be referred to as a SIMD register unit.

The data arrangement unit 170 may arrange the results of operations that are processed by the parallel operator 150. For example, the data arrangement unit 170 may arrange ACS operation results that are obtained by the ACS operation. In an example in which the ACS operation is performed on a plurality of columns, the data arrangement unit 170 may arrange operation results associated with a current column, so that the arranged operation results may be used as inputs of a next column Subsequently, the parallel operator 150 may combine the arranged operation results with operation results that are associated with a previous column, and may store the combined operation results in the parallel register unit 160.

Figure 2:
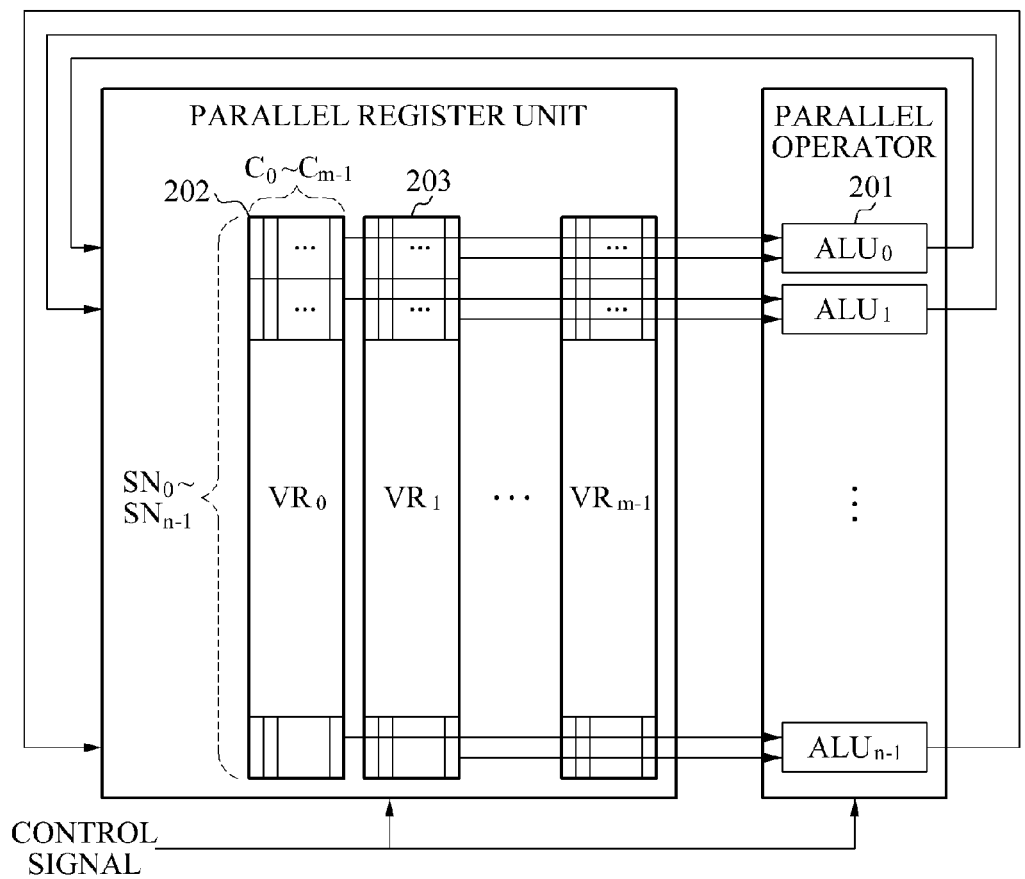
FIG. 2 is a diagram illustrating an example of a parallel register unit.

FIG. 2 illustrates an example of the parallel register unit, for example, the parallel register unit 160 of FIG. 1.

Referring to FIG. 2, the parallel register unit includes a plurality of vector registers such as vector registers $VR_0$ through $VR_{m-1}$.

In this example, a parallel operator includes a plurality of Arithmetic Logical Units (ALUs), for example $ALU_0$ through $ALU_{n-1}$. The plurality of ALUs may correspond to a number of source nodes, for example source nodes $SN_0$ through $SN_{n-1}$. For example, if "N−1" source nodes exist, the parallel operator 150 may include "N−1" ALUs.

An ALU may read two pieces of input data from among pieces of input data that are stored in the parallel register unit, may perform an operation on the read input data, and may store a single operation result in the parallel register unit. For example, an $ALU_0$ 201 may read input data stored in a vector register $VR_o$ 202, and input data stored in a vector register $VR_1$ 203. The $ALU_0$ 201 may perform an operation for Viterbi decoding of the two pieces of read input data, and may obtain a single operation result. Subsequently, the $ALU_0$ 201 may store the obtained operation result in one of the vector registers. For example, the $ALU_0$ 201 may store the obtained operation result in an unnecessary space of the vector register $VR_0$ 202, or in an empty space among vector registers $VR_2$ through $VR_{m-1}$.

Hereinafter, examples of performing the BMC operation, the ACS operation, and the TB operation using the SIMD processor are described.

Figure 3:
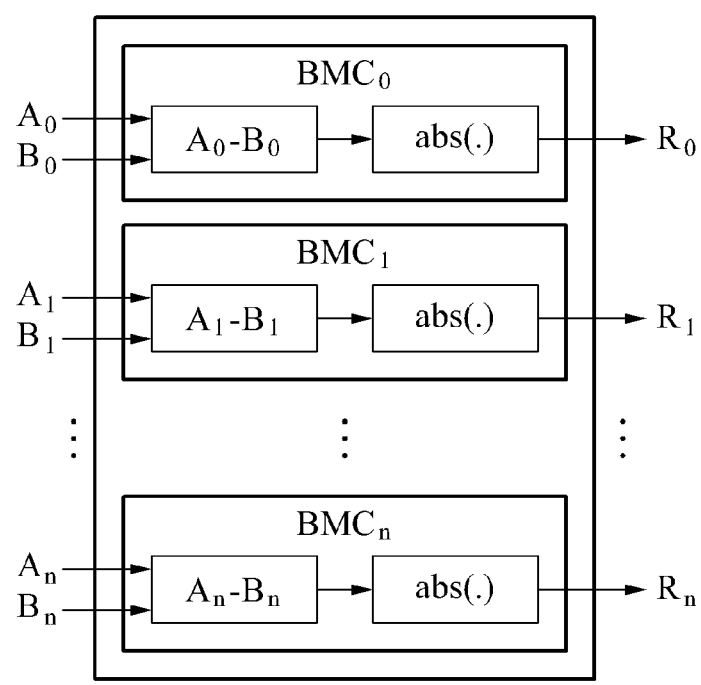
FIG. 3 is a diagram illustrating an example of processing Branch Metric Computation (BMC) operations in parallel.

FIG. 3 illustrates an example of processing BMC operations in parallel. For example, the BMC operations may be performed by the parallel operator 150 of FIG. 1.

Referring to FIG. 3, a parallel operation processing apparatus may output a result $R_0$ that is obtained by calculating an absolute value of a difference between data $A_0$ and $B_0$. Similarly, the parallel operation processing apparatus may perform, in parallel, BMC operations on all "n" source nodes that are included in a current column.

In other words, because a result of a BMC operation is not used as an input of another BMC operation, the BMC operations may be simultaneously performed in source nodes in the current column. For example, the parallel operation processing apparatus may simultaneously perform BMC operations $BMC_0$ through $BMC_n$, and may output results as $R_0$ through $R_n$.

Figure 4:
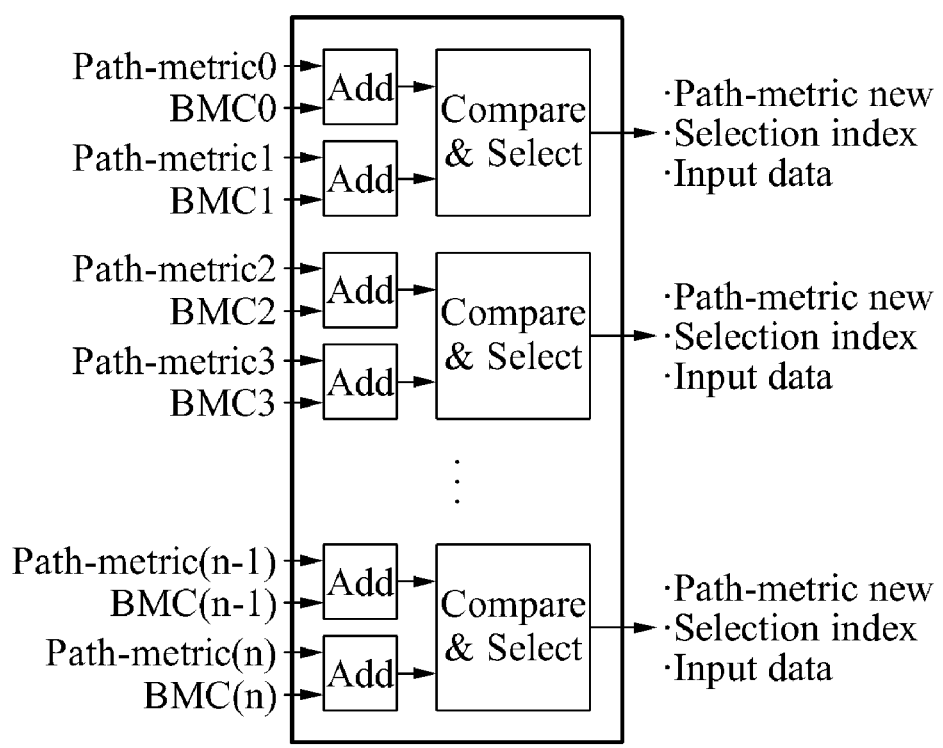
FIG. 4 is a diagram illustrating an example of processing Add-Compare-Select (ACS) operations in parallel.

FIG. 4 illustrates an example of processing ACS operations in parallel. For example, the ACS operations may be performed by the parallel operator 150 of FIG. 1.

Referring to FIG. 4, a parallel operation processing apparatus may select a path value from among path values that are obtained by adding a metric of each of nodes in a current column to a path value of each of nodes in a previous column, and may output the selected path value.

Figure 5:
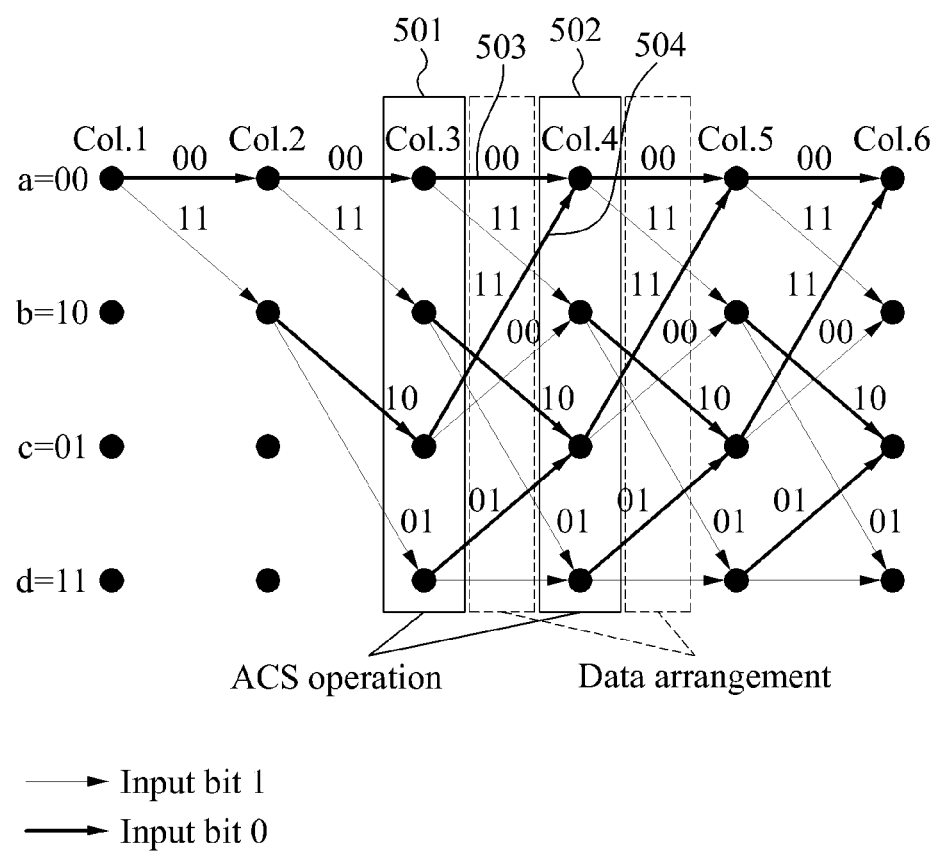
FIG. 5 is a diagram illustrating an example of a Viterbi algorithm using a trellis diagram.

Referring to the example of the trellis diagram in FIG. 5, when two paths (namely, a path (0) 503 and path (1) 504) are input to a source node "a" included in a column (4) 502 (a current column), a parallel operation processing apparatus may add metric 0 corresponding to the path (0) 503 to a path value of a source node "a" in a column (3) 501 (a previous column), and may add metric 1 corresponding to the path (1) 504 to a path value of a source node "c" in the column (3) 501. Subsequently, the parallel operation processing apparatus may compare the two result values. For example, the metric 0 and metric 1 may respectively correspond to a path-metric 0 and path-metric 1 of FIG. 4, and the path value of the source node "a" and path value of the source node "c" may respectively correspond to BMC 0 and BMC 1 of FIG. 4.

The parallel operation processing apparatus may output the smaller value of the two result values as a path value 401 of the current column, may select a path corresponding to the path value 401, and may output input data 403 corresponding to the selected path. The parallel operation processing apparatus may also output index information 402 that indicates a source node in a previous column that is connected to a source node in the current column based on the selected path.

For example, if a value of "13" is obtained by adding the metric 0 to the path value in the source node "a" in the column (3) 501, and if a value of "8" is obtained by adding the metric 1 to the path value in the source node "c" in the column (3) 501, the parallel operation processing apparatus may output "8" as the path value 401. The parallel operation processing apparatus may select the path (1) 504 corresponding to the path value of "8" from between the path (0) 503 and path (1) 504. The parallel operation processing apparatus may output the index information 402 indicating that the source node "a" in the column (4) 502 is logically connected to the source node "c" in the column (3) 501 based on the selected path (1) 504. The parallel operation processing apparatus may output the input data 403 corresponding to the selected path (1) 504.

As described herein, the parallel operation processing apparatus may output a path value of the current column, index information, and input data, for each of the source nodes included in the current column, through the ACS operations.

Figure 6:
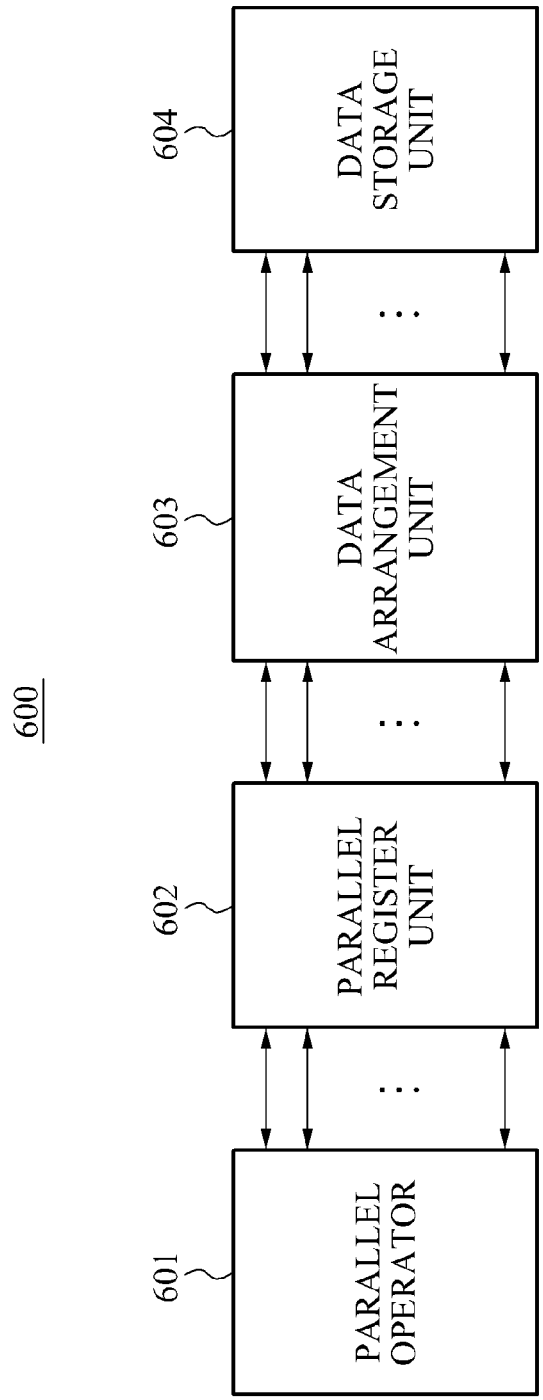
FIG. 6 is a diagram illustrating examples of components used to perform an ACS operation from among components of a parallel operation processing apparatus.

FIG. 6 illustrates examples of components used to perform an ACS operation from among components of a parallel operation processing apparatus.

In FIG. 6, parallel operation processing apparatus 600 includes a parallel operator 601, a parallel register unit 602, a data arrangement unit 603, and a data storage unit 604.

The parallel operator 601 may calculate a path value of each of the source nodes included in a current column. The path value refers to a value that is obtained by accumulating, based on a current column, metrics of source nodes computed for each column In other words, the path value may indicate a value that is obtained by adding metrics in source nodes in each of the previous columns to metrics in source nodes in the current column, based on the source nodes in the current column. The path value may refer to, for example, a value that is obtained by accumulating Hamming distances in Viterbi decoding.

The parallel operator 601 may select a path using the calculated path values. For example, if a plurality of path values are calculated, the parallel operator 601 may determine a smallest path value among the plurality of path values as a minimum path value, and may select a path corresponding to the minimum path value. Subsequently, the parallel operator 601 may store the minimum path value in the parallel register unit 602 by overwriting the minimum path value to a location in which a minimum path value in the source nodes in the previous column is stored.

The parallel operator 601 may determine input data corresponding to the selected path, and may determine source nodes in the previous column based on the selected path. For example, the source nodes in the previous column may be logically connected to the source nodes in the current column, based on the selected path. Accordingly, the parallel operator 601 may determine index information indicating the source nodes in the previous column.

The data arrangement unit 603 may determine an order of input data of each of the source nodes in the current column, based on an order of input data of each of the source nodes in the previous column Hereinafter, the input data of each of the source nodes in the current column is referred to as input data for the current column, and the input data of each of the source nodes in the previous column is referred to as input data for the previous column.

The data arrangement unit 603 may arrange the input data for the current column For example, the data arrangement unit 603 may arrange the input data for the current column such that the input data for the current column is physically concatenated with the input data for the previous column As described herein, the source nodes in the previous column may be logically connected to the source nodes in the current column.

Figure 7:
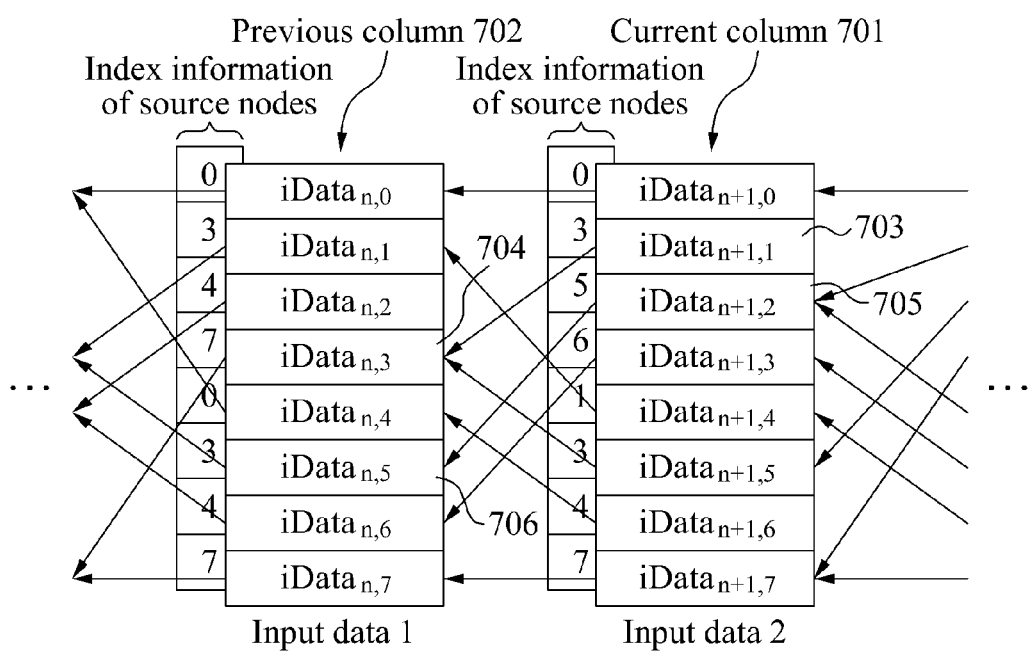
FIG. 7 is a diagram illustrating an example of arranging input data of source nodes in a current column.

FIG. 7 illustrates an example of arranging input data of source nodes.

For example, referring to FIGS. 6 and 7, the data arrangement unit 603 may arrange, in a vector register, input data corresponding to a source node 0 in the current column 701, so that the input data corresponding to the source node 0 is physically concatenated with input data corresponding to a source node 0 in the previous column 702. In this example, the source node 0 in the previous column 702 may be logically connected to the source node 0 in the current column 701. The data arrangement unit 603 may arrange, in the vector register, input data corresponding to the source node (1) 703 in a vector register, so that the input data corresponding to the source node (1) 703 is physically concatenated with input data corresponding to the source node (3) 704 that is logically connected to the source node (1) 703. Similarly, the data arrangement unit 603 may arrange input data corresponding to the source node (2) 705 through a source node 7 that is included in the current column 701.

The parallel operator 601 may combine the arranged input data for the current column with the input data for the previous column, based on a register processing unit, and may store the combined input data in the parallel register unit 602. The register processing unit may be used to represent a size of data that is capable of being simultaneously processed by the parallel register unit 602. For example, the size may be set in advance. The register processing unit may be set to, for example, 8 bits, 16 bits, 32 bits, and the like. As an example, if the register processing unit is set to 16 bits, the parallel register unit 602 may combine 16 bits of input data corresponding to source nodes in each of a plurality of columns, and may store the combined input data.

After the input data for the current column is arranged, the parallel operator 601 may perform a bit shift operation on the input data for the previous column In this example, the parallel operator 601 may combine the input data for the current column with the input data for the previous column through the bit shift operation, and may store the combined input data in the parallel register unit 602.

Figure 8:
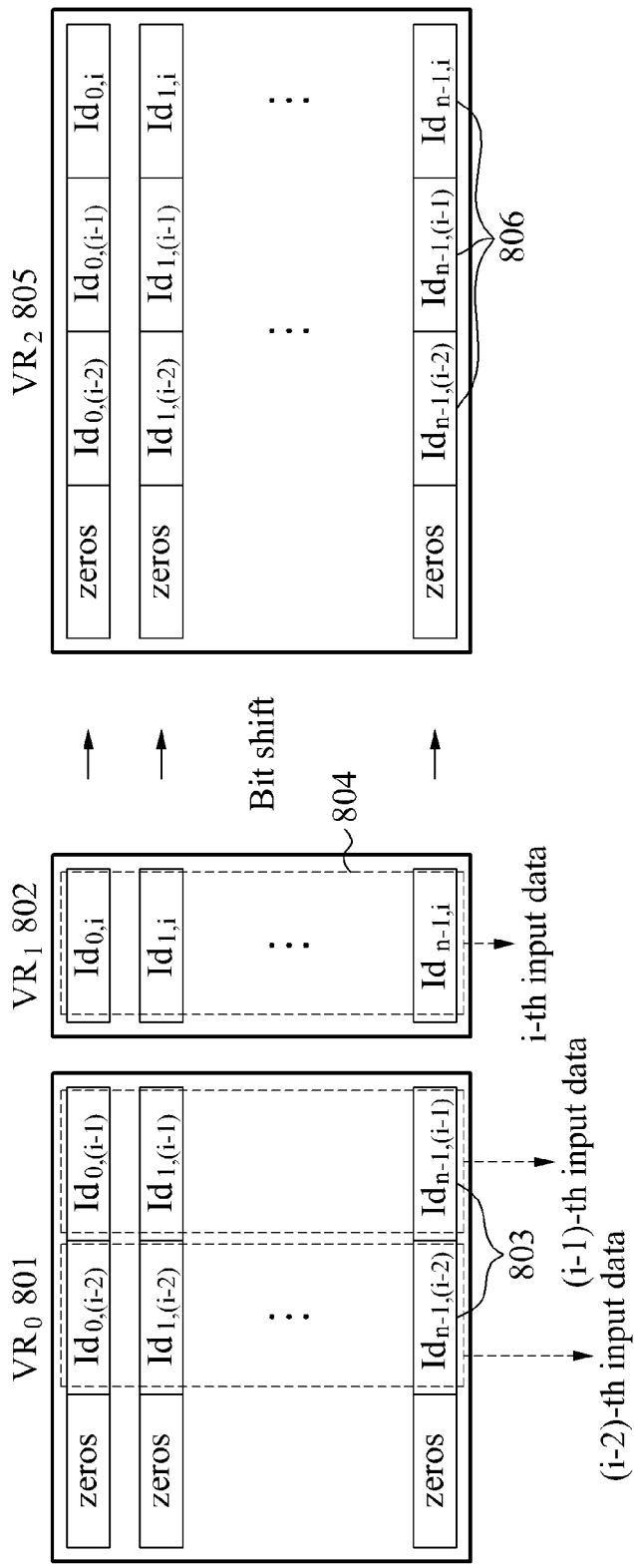
FIG. 8 is a diagram illustrating an example of a bit shift operation performed in a parallel operation processing apparatus.

FIG. 8 illustrates an example of a bit shift operation.

For example, referring to FIG. 8, if the register processing unit is set in advance to "k" bits, the bit shift operation may be performed on input data 803 for previous columns stored in a vector register $VR_0$ 801. As a result of the bit shift operation, a last column in the vector register $VR_0$ 801 may be filled with zeros. The parallel operator 601 may perform an exclusive OR (XOR) operation on the zeros and input data 804 for a current column, may combine the input data 804 with the input data 803, and may store the combined input data 806 in a vector register $VR_2$ 805. In other words, the arranged input data for the current column may be added to the input data for the previous columns such that the arranged input data for the current column is physically concatenated with the input data for the previous columns, and the added input data may be stored in the vector register.

Thus, it is possible to reduce or eliminate wasted bits, despite an ACS operation result occupying an extremely small bit, by combining input data for a current column with input data for previous columns and storing the combined input data based on the register processing unit.

Referring again to FIG. 6, the parallel operator 601 may repeat an operation of combining input data for a current column with input data for a previous column, for every register processing unit, until the last column is reached. For example, if the register processing unit is set to 16 bits, and if 160 columns exist, the parallel operator 601 may combine input data corresponding to a first column through a $16^{th}$ column among the 160 columns, and may store the combined input data in the parallel register unit 602. The parallel operator 601 may repeat the combining operation for the rest of the 160 columns In this example, the parallel operator 601 may repeat the combining operation a nine more times for a total of ten operations, based on the register processing unit of 16 bits. Subsequently, the parallel register unit 602 may store 10 times, in the data storage unit 604, input data arranged for each 16 columns.

Because the input data for the current column is arranged after the ACS operation is performed, the order of the input data may be different from the order of the input data for the previous column Accordingly, the parallel operator 601 may store, in the parallel register unit 602, index information indicating a logical connection relationship between source nodes in the current column and source nodes in the previous column For example, the parallel operator 601 may determine the logical connection relationship using a trellis diagram. The index information may be generated each time the ACS operation is performed for each column.

When the generated index information is stored for each column, memory may be wasted, which may result in a large number of memories and increase in size of hardware logic. The parallel register unit 602 may store the index information for every register processing unit, rather than storing the index information for each column. Thus, it is possible to reduce or eliminate wasted memory space, and to reduce the size of the hardware logic.

For example, the parallel operator 601 may store, in a current register, index information of each of source nodes in a last column of a previous register that are logically connected to each of the source nodes in a first column of the current register.

For example, referring to FIG. 2, if vector registers $VR_0$ 202 and $VR_1$ 203 are respectively assumed as a previous register in which input data of each of the source nodes in previous columns is stored, and as a current register in which input data of each of source nodes in a current column is stored, the parallel operator 601 may store, in the vector register $VR_1$ 203, index information for the current column, together with the input data for the current column In this example, if the register processing unit is set in advance to "k" bits, and if "n" columns exist, the parallel operator 601 may store, in the parallel register unit 602, index information for every "k" bits, until input data of each source node in an n-th column is stored.

The data storage unit 604 may store ACS operation results that are temporally stored in the parallel register unit 602. For example, the data storage unit 604 may store input data arranged for each column, index information for every register processing unit, a path value of a final source node, and the like. When the ACS operation results are stored in the data storage unit 604, the parallel register unit 602 may be re-used to perform a new operation.

An example in which the data storage unit 604 stores the arranged input data is described with reference to FIG. 6, however, this is merely an example. In another example, the parallel operation processing apparatus 600 may include another data storage unit that is connected directly to the parallel register unit 602. In this example, the other data storage unit may be used to store data, for example, data that has no relevance to an order of operation results, such as a BMC operation result.

Figure 9:
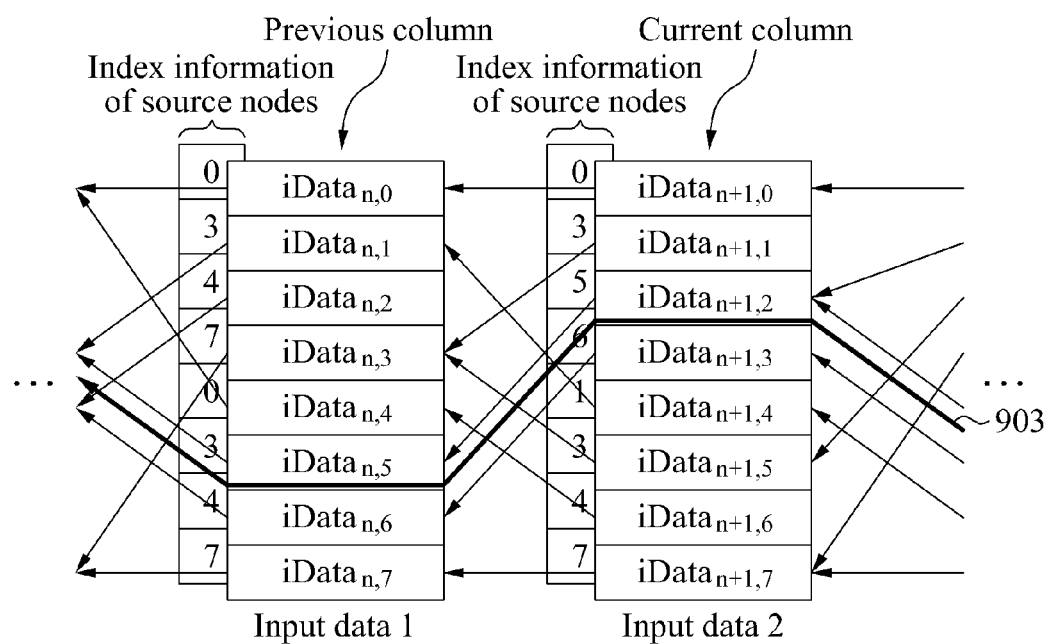
FIG. 9 is a diagram illustrating an example of processing Traceback (TB) operations in parallel.

FIG. 9 illustrates an example of processing TB operations in parallel. In FIG. 9, the TB operations may be performed by the parallel operator 150 of FIG. 1.

A parallel operation processing apparatus may compare path values of "m" source nodes included in an n-th column, namely, a last column The parallel operation processing apparatus may determine, as a final source node, a source node with a minimum path value among the "m" source nodes. Subsequently, the parallel operation processing apparatus may trace back input data corresponding to source nodes in previous columns that are logically connected to the final source node. For example, if there are "n+1" columns and each of the "n+1" columns includes eight source nodes, and if a source node 2 among eight source nodes included in an (n+1)-th column, namely a last column, has a minimum path value, the parallel operation processing apparatus may determine the source node 2 as a final source node.

Additionally, the parallel operation processing apparatus may trace back input data of a source node 5 in an n-th column that is logically connected to the source node 2, as indicated by a line 903 in FIG. 9. Similarly, the parallel operation processing apparatus may trace back input data of a source node 3 in an (n−1)-th column that is logically connected to the source node 5. In the same manner, the parallel operation processing apparatus may repeat the traceback from the last column to a first column in which n is equal to 0, and may acquire all input data.

Figure 10:
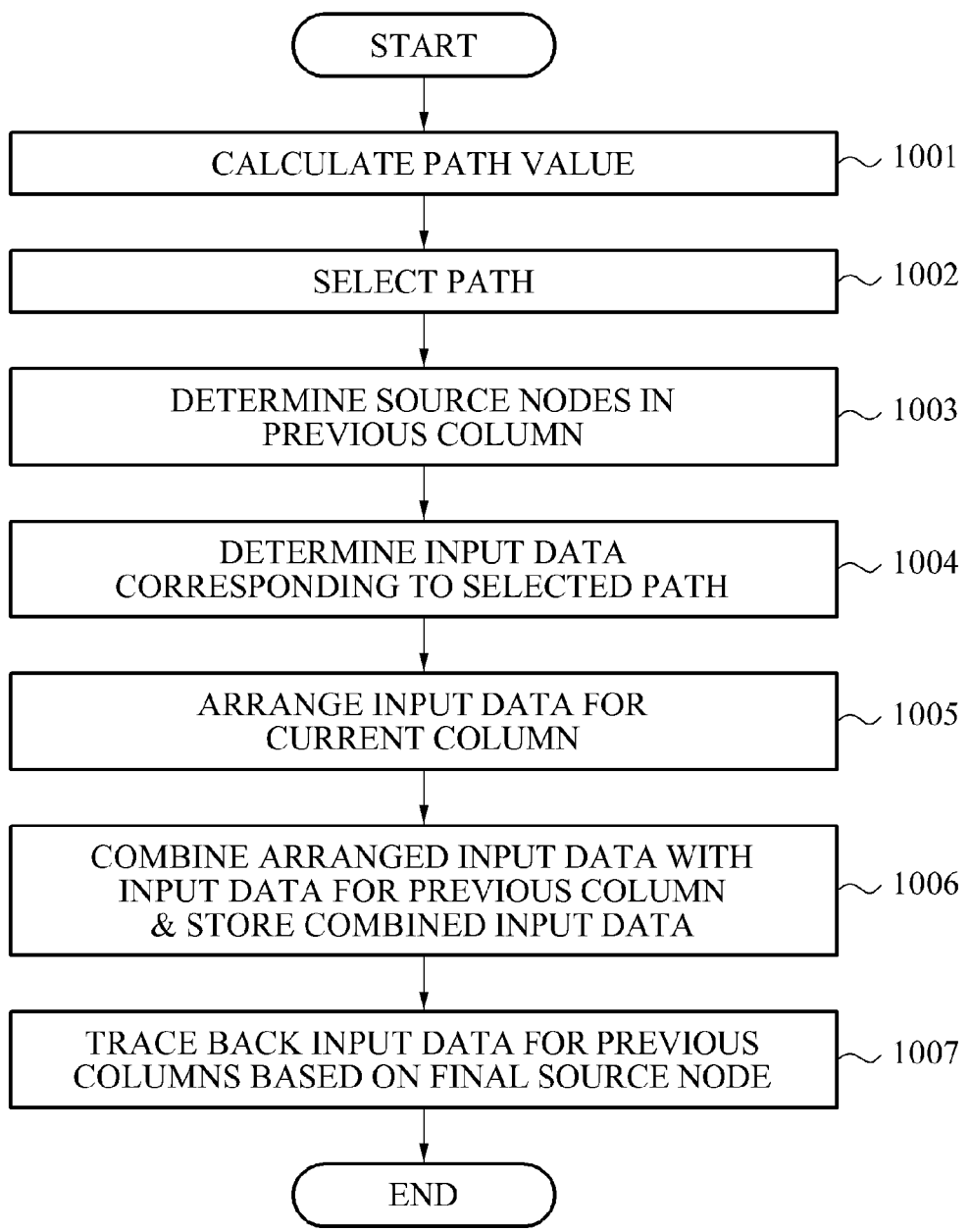
FIG. 10 is a flowchart illustrating an example of a method for processing Viterbi decoding in parallel using a SIMD processor.

FIG. 10 illustrates an example of a method for processing Viterbi decoding in parallel using a SIMD processor.

Referring to FIG. 10, in 1001, the parallel operation processing apparatus calculates a path value of each of the source nodes in a current column. For example, the path value may refer to a value that is obtained by accumulating, based on a current column, metrics of source nodes computed for each column.

In 1002, the parallel operation processing apparatus selects a path based on the path value. For example, if a plurality of path values are calculated, the parallel operation processing apparatus may determine, as a minimum path value, a smallest path value from among the plurality of path values, and may select a path corresponding to the minimum path value.

In 1003, the parallel operation processing apparatus determines source nodes in a previous column that are logically connected to the source nodes in the current column based on the selected path. For example, a source node 2 in the current column may be logically connected via a path 1 to a source node 1 in the previous column, and may also be logically connected via a path 4 to a source node 4 in the previous column. Additionally, if the path 1 corresponds to a path value of "10," and if the path 4 corresponds to a path value of "8," the parallel operation processing apparatus may determine a minimum path value for the source node 2 in the current column to be "8", and may select the path 4 from between the paths 1 and 4 that are logically connected to the source node 2 in the current column.

The parallel operation processing apparatus may store the determined minimum path value by overwriting the determined minimum path value at a location in which a minimum path value in the source nodes in the previous column is stored. For example, the minimum path value of "8" for the source node 2 may be stored by overwriting the minimum path value of "8" at a location in which a minimum path value in the source node 4 in the previous column is stored.

In 1004, the parallel operation processing apparatus determines input data corresponding to the selected path. For example, assuming that the source nodes 1 and 4 in the previous column are logically connected to the source node 2 in the current column, if input data corresponding to the source node 1 is "0", and if input data corresponding to the source node 4 is "1", the parallel operation processing apparatus may determine input data corresponding to the selected path 4 to be "1". In the same manner, the parallel operation processing apparatus may determine input data for each of the source nodes in the current column.

In 1005, the parallel operation processing apparatus arranges input data for the current column. For example, the parallel operation processing apparatus may arrange the input data for the current column, based on an order of input data for the previous column.

As an example, the parallel operation processing apparatus may arrange the input data of each source node in the current column such that the input data for the current column is physically concatenated with input data of each source node in the previous column The source nodes in the previous column may be logically connected to the source nodes in the current column.

In 1006, the parallel operation processing apparatus combines the arranged input data with the input data of the previous column, based on a register processing unit, and stores the combined input data. For example, the parallel operation processing apparatus may perform a bit shift operation on the input data for the previous column, combine the input data for the current column with the input data for the previous column, and store the combined input data. In this example, the input data for the current column may be aligned with the input data for the previous column, and the aligned input data may be stored.

Additionally, the parallel operation processing apparatus may store index information for every register processing unit which is generated by performing ACS operations for each column, instead of continuously storing the index information.

For example, the parallel operation processing apparatus may store, in a current register, index information on each of source nodes in a last column of a previous register that are logically connected to each of source nodes in a first column of the current register. In this example, the parallel operation processing apparatus may store index information for every register processing unit, combine the input data for the current column with the input to data for the previous column, and store the combined input data. Thus, it is possible to reduce or eliminate wasted memory space, and as a result the hardware logic may be reduced in size.

In 1007, the parallel operation processing apparatus traces back input data of source nodes in each of previous columns, based on a final source node.

For example, if 'n+1' columns exist, the parallel operation processing apparatus may calculate a path value of each of source nodes in an (n+1)-th column, namely a last column Additionally, the parallel operation processing apparatus may determine, as a minimum path value, a smallest path value from among the calculated path values, and may determine, as a final source node, a source node corresponding to the minimum path value. Subsequently, the parallel operation processing apparatus may trace back the input data of the source nodes in each of the previous columns, based on the final source node. The source nodes in each of the previous columns may be logically connected to the final source node. In this example, the parallel operation processing apparatus may repeat traceback of input data from the last column to a first column, namely a column corresponding to "n=0", and may acquire input data for all of the 'n+1' columns.

Accordingly, the parallel operation processing apparatus may combine the input data for the current column with the input data for the previous column, and may store the combined input data in a parallel register unit of the parallel operation processing apparatus. Accordingly, it is possible to reduce or eliminate a wasted memory space.

As described herein, the parallel operation processing apparatus may receive two pieces of input data and two path values, may perform the ACS operation, and may output a single ACS operation result. In other words, when four pieces of data are input, the hardware logic may be greatly increased in size. However, referring again to FIG. 2, the parallel operation processing apparatus may receive only two pieces of data, may perform the ACS operation, and may output a single ACS operation result.

Figure 11:
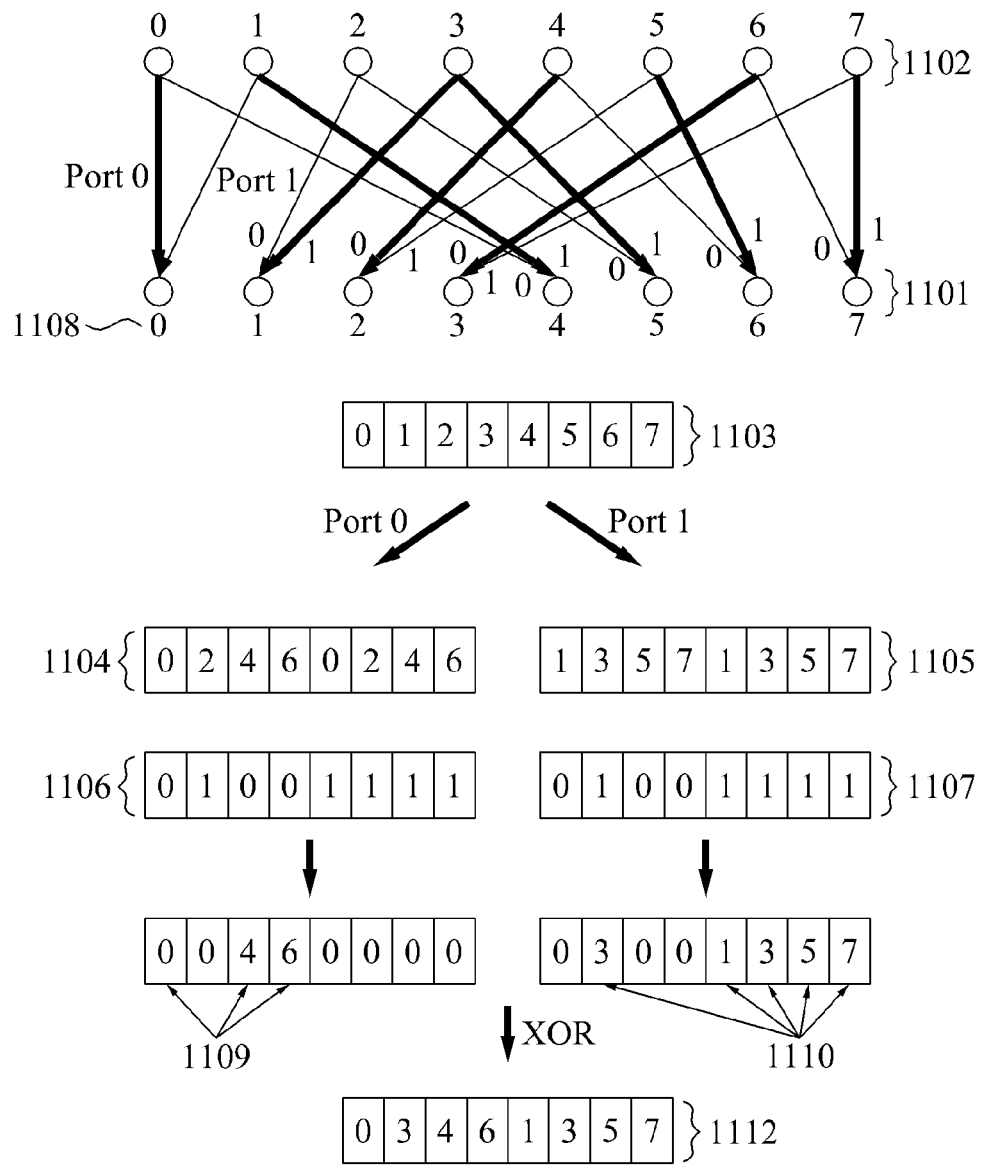
FIG. 11 is a diagram illustrating an example of processing an operation in response to an input of two pieces of data.

FIG. 11 illustrates an example of processing an operation in response to an input of two pieces of data. The operation of FIG. 11 may be performed by the parallel operator 150 of FIG. 1.

Referring to FIG. 11, the parallel operation processing apparatus may process the operation by distinguishing a port 0 corresponding to input data 0 from a port 1 corresponding to input data 1, from among paths input to source nodes in a current column.

For example, the parallel operation processing apparatus may divide source nodes in a previous column 1102 into a first group 1104 and a second group 1105. In this example, the source nodes in the previous column 1102 are logically connected to source nodes in a current column 1101.

The first group 1104 includes source nodes 0, 2, 4, 6, 0, 2, 4, and 6 that are logically connected via the port 0 to a part of source nodes in the current column 1101, and the second group 1105 includes source nodes 1, 3, 5, 7, 1, 3, 5, and 7 that are logically connected via the port 1 to the other part of the source nodes in the current column 1101. In FIG. 11, a source node 0 in the current column 1101 is logically connected via the port 0 to a source node 0 in the previous column 1102, and a source node 1 in the current column 1101 is logically connected via the port 0 to a source node 2 in the previous column 1102. Similarly, as illustrated in FIG. 11, it is possible to verify which source nodes in the previous column 1102 are logically connected to source nodes 3 through 7 in the current column 1101.

The parallel operation processing apparatus may determine input data corresponding to a path selected in each of the source nodes in the current column For example, the parallel operation processing apparatus may distinguish the port 0 from the port 1, and may determine the input data. In an example in which input data is determined in the port 0, the parallel operation processing apparatus may determine input data corresponding to a path determined in a source node (0) 1108 in the current column 1101 to be "0." In the same manner, the parallel operation processing apparatus may determine input data corresponding to a path determined in each of the source nodes 1 through 7 in the current column 1101. Accordingly, input data 1106 determined in each of the source nodes 0 through 7 in the current column 1101 includes 0, 1, 0, 0, 1, 1, 1, and 1. In another example in which input data is determined in the port 1, the parallel operation processing apparatus may determine input data corresponding to a path determined in each of the source nodes 1 through 7 in the current column 1101. In this example, the determined input data 1107 includes 0, 1, 0, 0, 1, 1, 1, and 1.

Subsequently, the parallel operation processing apparatus may determine source nodes in the previous column that correspond to input data of "0" from among the determined input data, and that are connected to the source nodes in the current column.

In an example of the port 0, the parallel operation processing apparatus may select source nodes in the current column 1101 that correspond to input data of "0" among the input data 1106. For example, source nodes 0, 2, and 3 in the current column 1101 correspond to the input data of "0." The parallel operation processing apparatus may determine source nodes in the previous column 1102 that are logically connected to the selected source nodes in the current column 1101. For example, the apparatus may determine that source nodes 0, 4, and 6 in the previous column 1102 are logically connected to the selected source nodes 0, 2, and 3 in the current column 1101.

In the same manner, in the example of the port 1, the parallel operation processing apparatus may select source nodes in the current column 1101 that correspond to input data of "1" from among the input data 1107. For example, source nodes 1, 4, and 7 in the current column 1101 correspond to the input data of "1." The parallel operation processing apparatus may determine source nodes in the previous column 1102 that are logically connected to the selected source nodes in the current column 1101. For example, the apparatus may determine that source nodes 3, 1, 3, 5, and 7 in the previous column 1102 are logically connected to the selected source nodes 1, 4, and 7 in the current column 1101.

The parallel operation processing apparatus may perform the XOR operation on the source nodes in the previous column 1102 that are logically connected to the source nodes in the current column 1101 selected in the port 0, with the source nodes in the previous column 1102 that are logically connected to the source nodes in the current column 1101 selected in the port 1. Additionally, the parallel operation processing apparatus may determine source nodes 1112 in the previous column corresponding to the selected path, from among the source nodes in the previous column that are logically connected to the source nodes in the current column, based on a result of the XOR operation.

In this example, the parallel operation processing apparatus may output "0, 3, 4, 6, 1, 3, 5, 7" as the result of the XOR operation. The parallel operation processing apparatus may determine, based on an operation result "0", that a source node 0 in the current column 1101 is logically connected to a source node 0 in the previous column 1102, and may determine, based on an operation result "3", that a source node 1 in the current column 1101 is logically connected to a source node 3 in the previous column 1102. In the same manner, the parallel operation processing apparatus may determine source nodes in the previous column 1102 that are logically connected to source nodes 2 through 7 in the current column 1101, based on the result of the XOR operation.

In other words, the parallel operation processing apparatus may process the ACS operation by distinguishing port 0 from port 1. Additionally, using the XOR operation, the parallel operation processing apparatus may determine a source node in the previous column that corresponds to a path selected in each of the source nodes in the current column, from among the source nodes in the previous column that are logically connected to the source nodes in the current column. Accordingly, the parallel operation processing apparatus may receive input of two pieces of data, perform the ACS operation, and output a single ACS operation result. Thus, it is possible to reduce complexity of the hardware logic by reducing a number of data input that is used for the ACS operation from four to two.

As described in various examples herein, it is possible to effectively use memory by performing Viterbi decoding using an SIMD processor, thereby reducing a size of the overall hardware logic.

Additionally, a plurality of pieces of input data may be combined and stored during an ACS operation, and thus it is possible to reduce or eliminate a wasted memory space. In addition, it is possible to quickly process a TB operation by tracking back a large amount of input data by reading data one time.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running.

As a non-exhaustive illustration only, a terminal/device/unit described herein may refer to mobile devices such as a cellular phone, a personal digital assistant (PDA), a digital camera, a portable game console, and an MP3 player, a portable/personal multimedia player (PMP), a handheld e-book, a portable lab-top PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer. It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A parallel operation processing apparatus, comprising:
 a parallel operator configured to calculate a path value of source nodes in a current column, and to determine input data and at least one source node in a previous column, the input data corresponding to a path selected using the path value; and
 a data arrangement unit configured to arrange first input data of the source nodes in the current column, based on an order of second input data of the at least one source node in the previous column,
 wherein the parallel operator combines the arranged first input data with the second input data, based on a register processing unit, and stores the combined input data in a parallel register unit.

2. The parallel operation processing apparatus of claim 1, wherein the parallel operator is configured to perform a bit shift operation on the second input data, combine the arranged first input data with the second input data on which the bit shift operation is performed, and store the combined input data.

3. The parallel operation processing apparatus of claim 1, wherein the data arrangement unit is configured to arrange the first input data such that the first input data is physically concatenated with the second input data.

4. The parallel operation processing apparatus of claim 1, wherein the parallel operator is configured to store, for every register processing unit, index information indicating the at least one source node in the previous column.

5. The parallel operation processing apparatus of claim 4, wherein the index information comprises information about source nodes in a last column of a previous register that are logically connected to source nodes in a first column of a current register, based on the selected path.

6. The parallel operation processing apparatus of claim 1, wherein, if a plurality of path values exist in each of the source nodes in the current column, the parallel operator is further configured to determine a minimum path value among the plurality of path values, and store the determined minimum path value in the parallel register unit by overwriting the determined minimum path value to a location in which a minimum path value in the at least one source node in the previous column is stored.

7. The parallel operation processing apparatus of claim 1, wherein the parallel operator is configured to calculate path values in source nodes in a last column, and trace back input data of source nodes in previous columns that are connected to a final source node corresponding to a minimum path value among the calculated path values.

8. The parallel operation processing apparatus of claim 7, wherein the parallel operator is configured to acquire input data corresponding to source nodes connected to the final source node by repeating the tracing from the source nodes in the last column to source nodes in a first column.

9. The parallel operation processing apparatus of claim 1, wherein the parallel operator is configured to calculate the path value by accumulating, based on the current column, metrics of source nodes computed for each column by performing Viterbi decoding.

10. The parallel operation processing apparatus of claim 1, wherein the at least one source node in the previous column is logically connected to each of the source nodes in the current column based on the selected path.

11. A parallel operation processing method, comprising:
calculating a path value of source nodes in a current column;
determining input data and at least one source node in a previous column, the input data corresponding to a path selected using the path value;
arranging first input data of the source nodes in the current column, based on an order of second input data of the at least one source node in the previous column; and
combining the arranged first input data with the second input data, based on a register processing unit, and storing the combined input data.

12. The parallel operation processing method of claim 11, wherein the combining comprises performing a bit shift operation on the second input data, combining the arranged first input data with the second input data on which the bit shift operation is performed, and storing the combined input data in a parallel register unit.

13. The parallel operation processing method of claim 11, wherein the arranging comprises arranging the first input data such that the first input data is physically concatenated with the second input data.

14. The parallel operation processing method of claim 11, wherein the combining comprises storing, for every register processing unit, index information indicating the at least one source node in the previous column.

15. The parallel operation processing method of claim 14, wherein the index information comprises information about source nodes in a last column of a previous register that are logically connected to source nodes in a first column of a current register based on the selected path.

16. The parallel operation processing method of claim 11, wherein the determining comprises, if a plurality of path values exist in each of the source nodes in the current column, determining a minimum path value among the plurality of path values, and the combining comprises storing the determined minimum path value in the parallel register unit by overwriting the determined minimum path value to a location in which a minimum path value in the at least one source node in the previous column is stored.

17. The parallel operation processing method of claim 11, wherein the calculating comprises calculating path values in source nodes of a last column, and tracing back input data of source nodes of previous columns that are connected to a final source node corresponding to a minimum path value among the calculated path values.

18. The parallel operation processing method of claim 17, wherein the calculating comprises acquiring input data corresponding to source nodes connected to the final source node by repeating the tracing from the source nodes in the last column to source nodes in a first column.

19. The parallel operation processing method of claim 11, wherein the path value is calculated by accumulating, based on the current column, metrics of source nodes computed for each column by performing Viterbi decoding.

20. The parallel operation processing method of claim 11, wherein the at least one source node in the previous column is logically connected to each of the source nodes in the current column based on the selected path.

21. A non-transitory computer-readable storage medium having stored therein program instructions to cause a computer to implement a parallel operation processing method comprising:
calculating a path value of source nodes in a current column;
determining input data and at least one source node in a previous column, the input data corresponding to a path selected using the path value;
arranging first input data of the source nodes in the current column, based on an order of second input data of the at least one source node in the previous column; and
combining the arranged first input data with the second input data, based on a register processing unit, and storing the combined input data.

* * * * *